United States Patent [19]

Brandolf

[11] Patent Number: 4,485,759
[45] Date of Patent: Dec. 4, 1984

[54] PLANETARY SUBSTRATE SUPPORT APPARATUS FOR VAPOR VACUUM DEPOSITION COATING

[75] Inventor: Henry E. Brandolf, Inver Grove Heights, Minn.

[73] Assignee: Multi-Arc Vacuum Systems Inc., Saint Paul, Minn.

[21] Appl. No.: 458,902

[22] Filed: Jan. 19, 1983

[51] Int. Cl.³ .............................................. B05C 11/14
[52] U.S. Cl. ................................. 118/503; 118/500; 118/728; 118/729; 118/730
[58] Field of Search ............... 118/500, 503, 728, 729, 118/730

[56] References Cited

U.S. PATENT DOCUMENTS

| | | | |
|---|---|---|---|
| 3,858,547 | 1/1975 | Bergfelt | 118/730 |
| 3,983,838 | 10/1976 | Christensen | 118/730 |
| 4,108,107 | 8/1978 | Scheuermann | 118/730 |
| 4,295,903 | 10/1981 | Farfaglia | 118/503 X |

Primary Examiner—Thurman K. Page
Attorney, Agent, or Firm—Merchant, Gould, Smith, Edell, Welter & Schmidt

[57] ABSTRACT

A substrate support apparatus (40) for reliably rotatably supporting substrates being coated within an evacuated physical vapor deposition chamber, is disclosed. A base member (41) defining one or more work stations (43) is configured and mounted for movement within a deposition coating chamber (20) such that the work station(s) move along a closed path in the chamber, past one or more coating material sources (25). Substrate holder assemblies (50), configured to support one or more substrates (30) to be coated, are mounted for rotation about auxiliary axes (47) at selectable ones of the work stations. Unique bearing means (65, 67), operable over wide temperature variations, rotatably support the substrate holder assemblies and provide good electrical conduction from the base member (41) to the substrates (30). Bearing surfaces (67b) are protected from contamination by the coating plasma (25a). Independent activating means (70, 72) selectively engage and rotate the substrate holder assemblies through predetermined numbers of degrees, at selected positions along the closed path. A simple vane configuration (62, 63) is used for accepting the activating forces. Stabilizing means (80) are provided for supporting unstable substrates upon the substrate holder assemblies (50). Simple attachment and removal of the substrate holder assemblies (50) to and from the base member (41) enhances use-flexibility of the apparatus.

37 Claims, 11 Drawing Figures

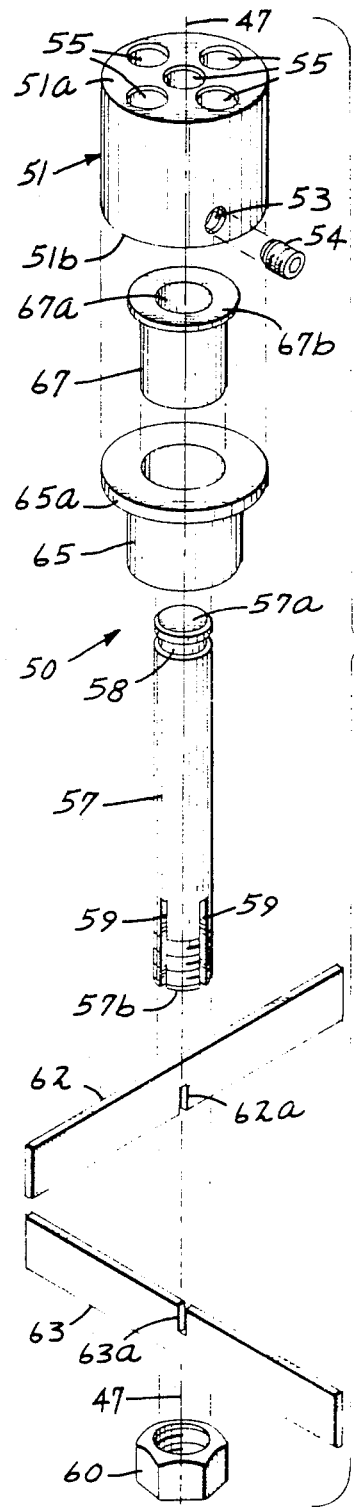
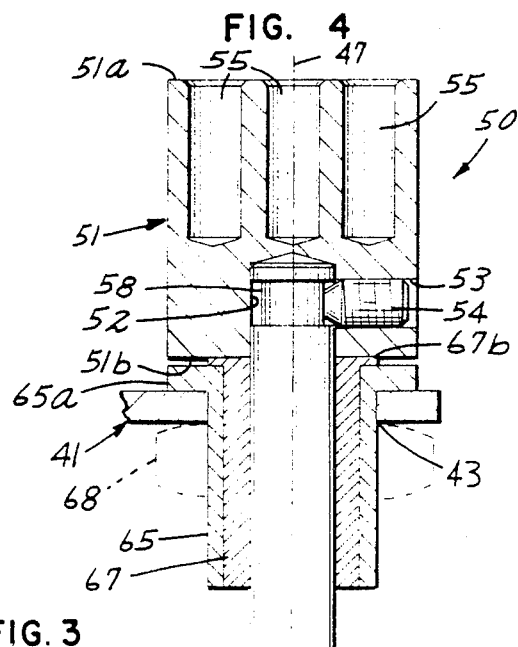
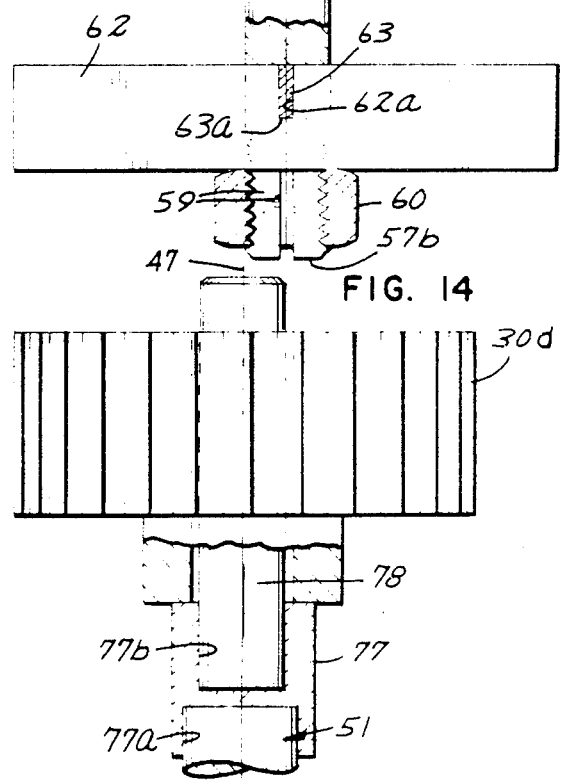

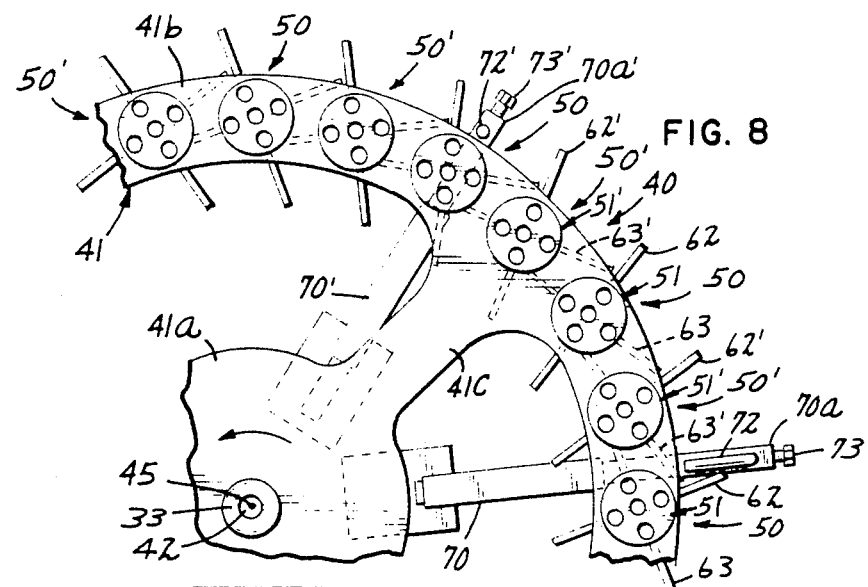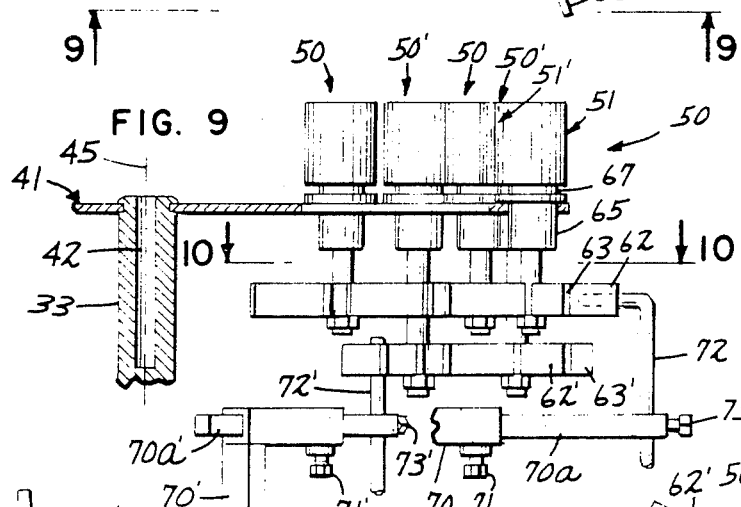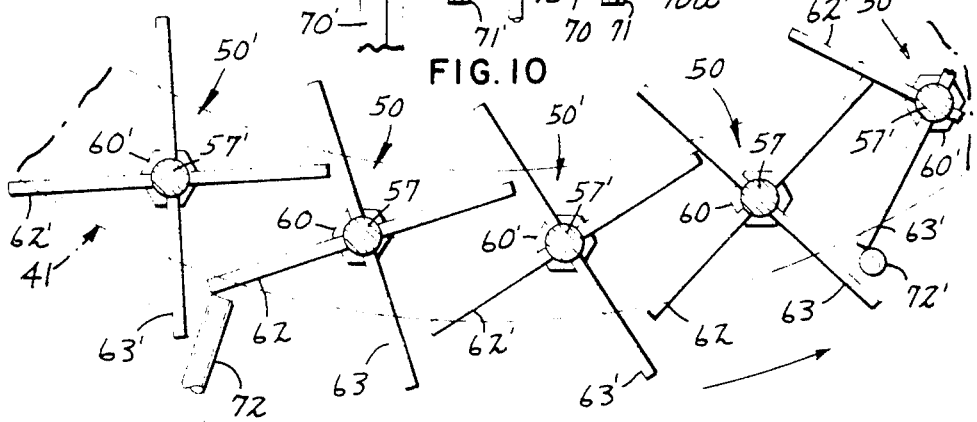

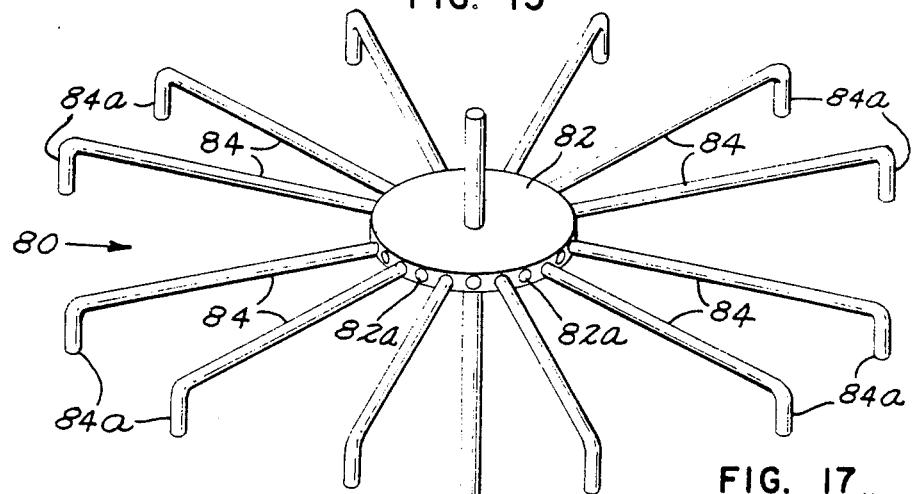
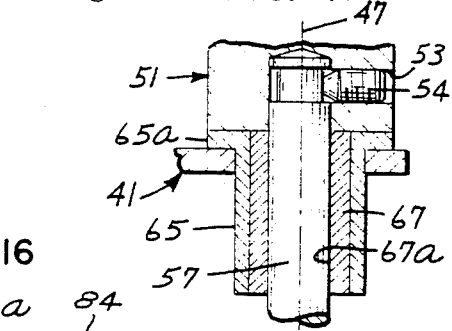
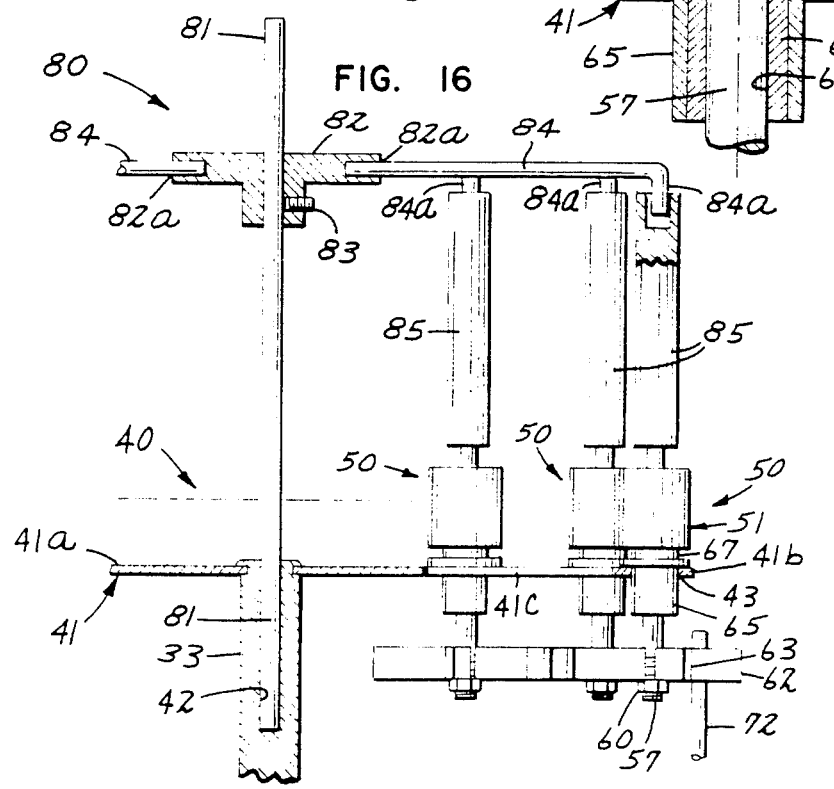

PLANETARY SUBSTRATE SUPPORT APPARATUS FOR VAPOR VACUUM DEPOSITION COATING

FIELD OF THE INVENTION

This invention relates generally to vapor deposition apparatus, and more particularly to an apparatus for rotating substrates in planetary motion within a line-of-sight vacuum vapor deposition chamber, to enable uniform coating of the substrates.

DESCRIPTION OF THE PRIOR ART

Vapor deposition coating processes can generally be categorized into the "chemical" and the "physical" vapor deposition disciplines. Both generally incorporate a deposition or coating chamber in which a "plasma" of the coating material is produced, and projected toward a substrate to be coated. The substrate may represent a flat surface, or may represent an inr-regular surface or volumetric shape. The uses of the coatings applied to the substrates, and the materials which comprise the substrates themselves can vary widely, from decorative coatings on ceramic or pottery materials, to circuit interconnection wiring paths on the surfaces of semi-conductor chips, to wear-resistant coatings on cutting tool and bearing surfaces. Similarly, the physical natures and properties of the coating materials used vary widely, from conductive coatings, to semiconductive coatings to those forming electrical insulators.

The term "chemical vapor deposition" generally refers to that vapor deposition process wherein the coating plasma is formed by introducing reactive gaseous elements into a deposition chamber, which gaseous elements react to form gaseous compounds that comprise plasma. Chemical vapor deposition processes may include evacuation of the deposition chamber prior to a deposition "run" to purge the chamber of impurities, but generally do not require an evacuated environment during the actual deposition process, which is often performed at positive (above atmosphere) pressure levels. Another characteristic typical of chemical vapor deposition techniques is that the plamsa particles do not generally follow straight-line or line-of-sight paths from the reactive source to the substrate within the chamber.

Although the apparatus of this invention can be effectively used within a chemical vapor deposition chamber, the advantages of its use are manifested most when it is used in deposition chambers which employ physical vapor deposition techniques. Physical vapor deposition processes generally require evacuation of the deposition chamber prior to as well as during the deposition coating process or "run". At least a portion of the coating material to be deposited is generally present in the deposition chamber as a solid source material prior to evacuation of the chamber, and is acted upon by a stimulus that converts the solid source material into a plasma of vapors and solid particulate matter. Once converted into a plasma, the coating source materials may be further combined with other reactive gasses or elements within the chamber to form coating compounds and molecules prior to actual deposition thereof onto substrate(s). Particles and component elements of the plasma are often ionized. The plasma typically comprises atoms, molecules, ions, ionized molecules and agglomerates of molecules.

The substrate coating process within the vacuum chamber of such physical vapor deposition systems is typically performed primarily by a "line-of-sight" deposition method. The coating plasma is directed toward the substrate(s) to be coated, generally in a straight line or line-of-sight path from the plasma generating source. Electric and magnetic fields may be used to shape or define the plasma coating stream, and electrical biasing of the substrate and/or other portions of the deposition chamber may be employed to facilitate attraction of ionized components of the plasma toward the substrate(s).

The most commonly used physical vapor deposition techniques for converting the solid coating source material to a gaseous/vapor plasma are: (1) the resistance or induction heating method; (2) the electron beam or ion bombardment method; and (3) the electric arc method. In the resistance or induction heating physical vapor deposition techniques, the coating source material is sometimes placed within a crucible which is heated to its melting point. An alternative method is to pass high electrical current levels through the coating source material itself. As the source material melts, all or a portion of the solid material changes to a liquid molten state, which with further heating is converted to its gaseous vapor state to form the coating plasma.

With the electron beam and ion bombardment physical vapor deposition techniques, a molten pool of coating source material is created by bombarding the coating source material (in its solid state) with a high-energy beam of electrons and/or ions. In such art, the solid source material is typically referred to as a "target", toward which the electrons and/or ions are accelerated at high kinetic energy levels. The bombarding electrons and/or ions impart sufficient energy to the atoms and molecules of the target source coating material to convert a portion of the source material into atoms, ions, molecules, ionized molecules and agglomerates of molecules which leave the target source material in their vapor phase, comprising the coating plasma.

In the electric arc (also referred to as the arc-plasma) physical vapor deposition technique, an electric arc is generated and maintained between the coating source material, which is biased to serve as a cathode, and an anode which is spaced from the cathode source material. High electrical current levels in excess of 100 amperes typically pass through such electric arcs. The concentration of electric energy passing through the arc is visible on the surface of the cathode where the arc "touches" the cathode, and is typically referred to as a "cathode spot". The cathode spot moves in erratic, random manner across the surface of the source material, instantaneously vaporizing the coating source material into the coating plasma. The plasma particles created by the electric arc vapor deposition technique generally leave the solid source material at higher energy levels than those of the electron beam or ion bombardment techniques. The plasma particles created either by the electron/ion beam or by the electric arc techniques may also be further directed by magnetic or electrical fields or by electrostatic attraction toward the substrate(s) to be coated. The electric arc technique has been found to be particularly attractive to commercial coating applications, particularly to the deposition of wear-coat surfaces on cutting tools, bearings, gears and the like.

A problem common to all of the "line-of-sight" deposition coating techniques described above is the actual application of the plasma to the substrate(s) so as to "uniformly" coat the substate(s). The uniform coating problem is minimized when the substrate surface to be coated is generally flat and can be oriented perpendicular to the direction of movement of the plasma stream. (e.g. in the actual line-of-sight path of the plasma particles). However, the problem of uniformly coating the substrate(s) becomes more accute when irregular substrate surfaces such as drill bits or gear surfaces are being coated, and where commercial coating applications require that hundreds or thousands of such substrates be simultaneously coated within a single deposition run. In such instances, the difficulty of exposing "all" surfaces of the substrate(s) to be coated, to the plasma stream, is complicated by the fact that in attempting to do so, other substrates mask each other from direct exposure to the line-of-sight plasma stream particles traveling from the coating source. To help solve this problem, planetary rotation substrate holder devices have been configured for insertion within vacuum deposition chambers. Such planetary holders enable mounting of a plurality of substrates on a "satellite" base that rotates about a first axis of rotation, which is itself mounted upon a rotating base or table that generally rotates about a central axis of the deposition system, in a manner similar to the rotation of planets as they move in epicycloid manner about the sun.

A number of techniques for constructing such planetary-drive substrate holder systems for use in physical vapor deposition systems have been developed, but have generally been impractical for use over extended periods of time. Drive mechanisms that have been used in the past include "gear", "chain" and "friction" drive mechanisms. Such devices have encountered operability problems with both the primary drive means itself, as well as with the movable "satellite" elements of the planetary system. The severe environmental conditions in which the large number of moving parts of such systems must simultaneously and cooperatively move, have generally caused such systems to malfunction within relatively short periods of time. Such a malfunction during a deposition run can be extremely costly. In ion bombardment and electric arc physical vapor deposition systems, the moving mechnaical parts of such systems rapidly become coated and occluded with particulate debris and coating materials from ion bombardment and from the coating plasma during a deposition run. Such foreign matter increases friction between the movable parts, causing sticking and binding and adds to the already significant thermal expansion problems of the rotating parts. In such systems, it is not uncommon for the substrates and operative parts of the planetary system to be rapidly heated to temperatures of up to 1,500° Fahrenheit, causing severe thermal expansion of the substrate holder apparatus. The problem is further amplified by the fact that such heating is typically non-uniform over the drive system. Those portions of the holder apparatus which pass near the coating source are generally heated to much higher temperatures than these portions located downstream from the coating source. The combination of extreme and differential heating causes intermeshing gear, chain or friction systems to quickly bind and seize after relatively short periods of operative use.

In addition to the normal thermal heating problems, such planetary systems are exposed to further severe environmental conditions which limit their operative use, when used in electric arc vapor deposition systems. In electric arc deposition systems, high voltage potential levels of up to 2,000 volts are present within the evacuated chamber, and the planetary fixtures can typically be required to conduct electrical currents through and between their movable parts, in excess of 200 amperes. The combination of built-up foreign matter, high voltage, large currents and low vacuum pressure causes electrical arcing between the movable intermeshing parts of the planetary system, damaging the parts, and sometimes actually welding the parts together.

Prior arc planetary gear-driven systems have also typically been of very heavy (i.e. large mass) construction, which have made them impractical for use with electric arc vapor deposition systems. When used in electric arc systems the fixturing itself consumes a significant portion of the electric power that is intended for transmission through the fixturing to the substrates.

Another problem common to planetary fixture systems used with physical vapor deposition processes, relates to the use of lubricants for minimizing friction between the movable parts. High vapor pressure lubricants generally cannot be used with the low vapor pressure systems since they contaminate the deposition chamber. On the other hand, low vapor pressure lubricants have not been found to be practical for use within such deposition chambers since they are constructed of solid particles that themselves rapidly become coated and contaminated through ion bombardment and from the coating plasma, causing complete loss of their lubricating properties. In addition, electric arc vapor deposition techniques require any lubricants used to have good electrical conductivity over the full range of operative conditions to which such lubrications will be exposed in a coating process.

The present invention directly addresses the above-mentioned problems and deficiencies of the prior art substrate holder systems for uniformly coating a plurality of piece-parts or substrates within a physical vapor deposition chamber. The present invention provides a substrate holder apparatus for rotatably supporting a large number of substrates to be coated, along planetary-motion paths, in a simple, repeatable and reliable manner. The apparatus of this invention consumes minimal amounts of power, enabling most of the electrical current passing through the fixturing to be carried directly to the substrates being coated. The substrates holder apparatus uses high current-carrying bearing members which minimize friction between the moving parts of the system, over wide temperature variation, and which do not contaminate the low vapor pressure work chamber or themselves become contaminated and inoperative due to ion bombardment or to plasma coating particles within the chamber. The moving parts of the apparatus of this invention are generally operatively immune to coating by the coating plasma or other particulate particles within the deposition chamber, and reliably operate over extended periods of time and over numerous of deposition runs without requiring cleaning even after becoming heavily coated by the plasma over extended periods of use.

SUMMARY OF THE INVENTION

The present invention provides a simple, durable and highly reliable substrate holder apparatus for rotatably supporting one or a plurality of substrates within an evacuated physical vapor deposition chamber during a coating process. The simplicity of its principles of operation and construction provide the user with many degrees of use-flexibility in adapting the substrate support structure for reliably and uniformly coating substrates of practically any size, or configuration. The substrate holder apparatus of this invention minimizes the number of intermeshing moving parts that can stick, bind or sieze in operative use, and employs a simple yet highly effective bearing construction for minimizing frictional drag between critical moving parts. The substrate holder apparatus of this invention is particularly attractive for use with ion bombardment and electric-arc physical vapor deposition techniques, which require fixtures capable of operation over widely varying temperature ranges, and which require fixtures capable of carrying high electrical potentials under low vacuum pressures, without arcing, and capable of conducting large electrical currents.

The substrate holder apparatus of this invention generally has a base member configured for mounting in a physical vapor deposition chamber and defining at least one work station. Means are connected with the base member for moving the base member work station within the chamber so as to traverse a closed path. A substrate holder, suitable for holding at least one substrate to be coated, is rotatably mounted to the base member at the work station, and is rotatable about an auxiliary axis. The substrate holder can be readily rotated about its auxiliary axis, and is normally not restrained from movement about the axis as the substrate holder moves with the base member along the closed path. Activating means are positioned within the chamber adjacent the closed path that is traversed by the substrate holder. The activating means engage and rotate the substrate holder through a predetermined number of degrees about the substrate holder's auxiliary axis, as the holder passes the activating means. Therefore, as the substrate(s) carried by the substrate holder are carried through the deposition chamber along the closed path, they are selectively and periodically rotated about the auxiliary axis of the substrate holder by the activating means.

Typically a plurality of such activating means are spaced, at fixed locations, along the closed path taken by the substrate holder, with each of the activating means being operable to rotate the substrate holder a predetermined number of degrees about its auxiliary axis. The number of activating means which are engaged by the substrate holder as it traverses the closed loop path, determines the amount of rotation of the substrate holder as it completes the loop. The number of activating members, as well as the number of substrate holders mounted on the base member can be varied and selected to accommodate the type of substrates being used and the particular vapor deposition coating needs of the user. In a preferred construction of the invention, the base member is of generally circular construction, configured for rotation about a primary axis such that the mounting stations of the base generally follow a circular path about the primary axis. In a preferred configuration, the base member resembles a spoked wheel with portions thereof removed to decrease the mass of the base, and with a plurality of work stations circumferentially spaced around the periphery of the base. As the substrate holders at the work stations are rotated by the activating means, the substrates carried thereby, will move in a planetary motion along an epicycloid path about the primary axis. The activating members can be arranged and configured with respect to the substrate holder members such that different ones of the activating members selectively engage and rotate different ones of the plurality of substrate holders.

Each substrate holder can be configured to support one or a plurality of substrates of varied shape and configuration. For example, the substrate holder can be configured to hold a plurality of solid cylindrical tools (such as drill bits) in generally vertical orientation for rotation about the central axis or can be configured to hold cylindrical, ring-shaped substrates (such as gears and hobs). Further, such ring-shaped substrates can be coaxially stacked or mounted on the substrate holder for rotation about the auxiliary axis. Stabilizer means are also available for operative connection with the substrate holder(s) for stabilizing and maintaining orientation of larger/heavier substrates as they move through the deposition chamber.

In a preferred construction of the substrate holder member, the substrate holder includes one or a plurality of vane members laterally projecting outward from the auxiliary axis, for engagement by the activating means. In a preferred construction of the invention, the activating means includes one or several pawl members positioned along the path assumed by the substrate holder members, and oriented so as cooperatively engage the vane member(s) as the substrate holder passes thereby, causing the substate holder to rotate about its auxiliary axis until the respective vane member disengages from contact with the respective pawl member.

In general, when the vane members of a substrate holding member are uniformly angularly positioned around the holder member, the angle through which the substrate holder moves about its auxiliary axis due to engagement with any one pawl member equals 360 degrees divided by the number of vane members.

According to a preferred construction of the invention, a substrate holder has a substrate mounting head member which is configured to supportingly hold the substrate to be coated. Bearing means are interposed between the base member and the substrate mounting head member. The bearing means define a sliding bearing surface between the head and the base member which reduces friction and prevents sticking and binding of the rotating parts of the apparatus. For deposition coating systems which require application of an electric potential to the substrates, or which require conduction of current through the substrates and their support structure, the bearing means is preferably constructed of electrical conductive material which provides a good electrical conductive path between the base and the substrate mounting head member. In a preferred construction, the bearing material is constructed at least partially of graphite material, which serves as a good electrical conductor as well as providing a smooth bearing surface. The bearing may be constructed in the form of a bushing suitable for mounting to the base member at a work station. In a preferred construction, the bearing surface itself is shielded from the deposition coating material within the coating chamber by the overlying substrate mounting head member, thus preventing harmful deposits of the coating material on the bearing surface and extending its operative life.

While the present invention will be described without respect to its application and use with an electric arc vapor vacuum deposition assembly, it will be understood that the invention is not limited to such use, but that its principles apply equally well to all types of vapor vacuum deposition. The particular electric arc vapor deposition system described has been found to provide the worst environmental conditions under which the substrate support apparatus of this invention would be required to operate. The present invention will be described with respect to its application with the rotating base member configured as one integral piece, defining a plurality of work stations thereon, and rotatable about a central axis. However, it will be understood that the principles of this invention apply equally well to a base member of segmented and/or flexible portions having work stations movable along a closed path by a chain or conveyor or other appropriate drive structure. Similarly, since the shape of the closed path followed by the work stations is determined by the shape and configuration of the base member, while the present invention is described with respect to a circular closed path, its principles apply equally well to closed paths of any configuration, whether or not such paths are planar. In this regard, while rotational path is most generally used for moving substrates within a vapor deposition chamber, the principles of this invention would apply equally well to a closed path comprising a straight line movement wherein the work station progresses in a straight line past a coating source and returns along that same line to its original starting position, to "close" the path. Similarly, while the invention will be described with respect to a system wherein the plane of motion of the base member is generally horizontal, substrate support apparatus moving in a vertical or oblique manner are also included within this invention. Further while the substrate support apparatus will be described with respect to a structure which supports the substrates from below, the principles of this invention apply equally well to a substrate support structure from which the substrates could be hung. Many of the above considerations and design variations will be determined by the actual construction of the deposition chamber in which the support structure will be used. In this regard, while the invention will be described generally with regard to movement of the substrates in relation to a single coating source, it will be understood that the typical deposition chamber will have multiple such coating sources typically located around the sides and often times on the top and bottom of the coating chamber as well.

While the present invention will be described with respect to a movement activating structure which uses cantilevered vanes which are engaged by a stationary pawl member, other activating means, such as notches or grooves within the substrate holder could be employed. The principle of the invention relevant in this regard is that the rotatable substrate holder is a "passive" element that is not continually engaged (such as with a gear-driven system) with the activating means, but only periodically receives a motion-imparting stimulus from the activating means, at predetermined positions along the closed path traversed by the work stations. While the invention will be described as being constructed from particular preferred materials, it will be understood that other materials which meet the thermal expansion, low outgassing and electrical conductivity requirements of the system could equally well be used. Further, while specific examples of substrates and appropriate holders therefore will be illustrated in description of the preferred embodiments of the invention, it will be understood that such substrate holders can assume multiple configurations which accommodate the particular nature of the substrate to be held thereby. It will be understood that those skilled in the art may readily perceive yet other variations of the invention not specifically described above or in the following specification, but clearly included within the scope of the appended claims.

BRIEF DESCRIPTION OF THE DRAWING

Referring to the Drawing, wherein like numerals represent like parts throughout the several views:

FIG. 3 is an exploded perspective view of one of the plurality of rotatable satellite substrate mounting members of the planetary substrate mounting apparatus illustrated in FIG. 1;

FIG. 4 is a cross-sectional view, with portions thereof broken away, of one of the rotatable satellite mounting member illustrated in FIGS. 1 and 3, as generally viewed along the Line 4—4 of FIG. 1;

FIG. 8 is a fragmentary top plan view of the mounting apparatus of FIG. 6, illustrating an alternate activating structure for rotating the plurality of satellite substrate mounting members;

FIG. 9 is a cross-sectional view of the mounting apparatus illustrated in FIG. 8, as generally viewed along the Line 9—9 of FIG. 8;

FIG. 10 is an enlarged cross-sectional view of the activating vann portion of the mounting apparatus illustrated in FIG. 9, as generally viewed along the Line 10—10 of FIG. 9, illustrating the rotational movement of the satellite substrate mounting members about their central axes;

FIG. 14 is an enlarged fragmentary view of a fourth variation of the upper substrate mounting base of the rotating satellite mounting member of FIG. 3, illustrating its use for supporting a large gear substrate;

FIG. 15 is a perspective view of a stabilizer member for use with the planatary substrate mounting apparatus of this invention;

FIG. 16 is a fragmentary cross-sectional view of the stabilizer apparatus of FIG. 15, illustrating its use with the planetary substrate mounting apparatus of the type illustrated in FIG. 1; and FIG. 17 is a fragmentary view of the bearing portion of the rotatable mounting member of FIG. 4 illustrating an alternate construction of the bearing means.

DETAILED DESCRIPTION OF THE INVENTION

Figure 1:
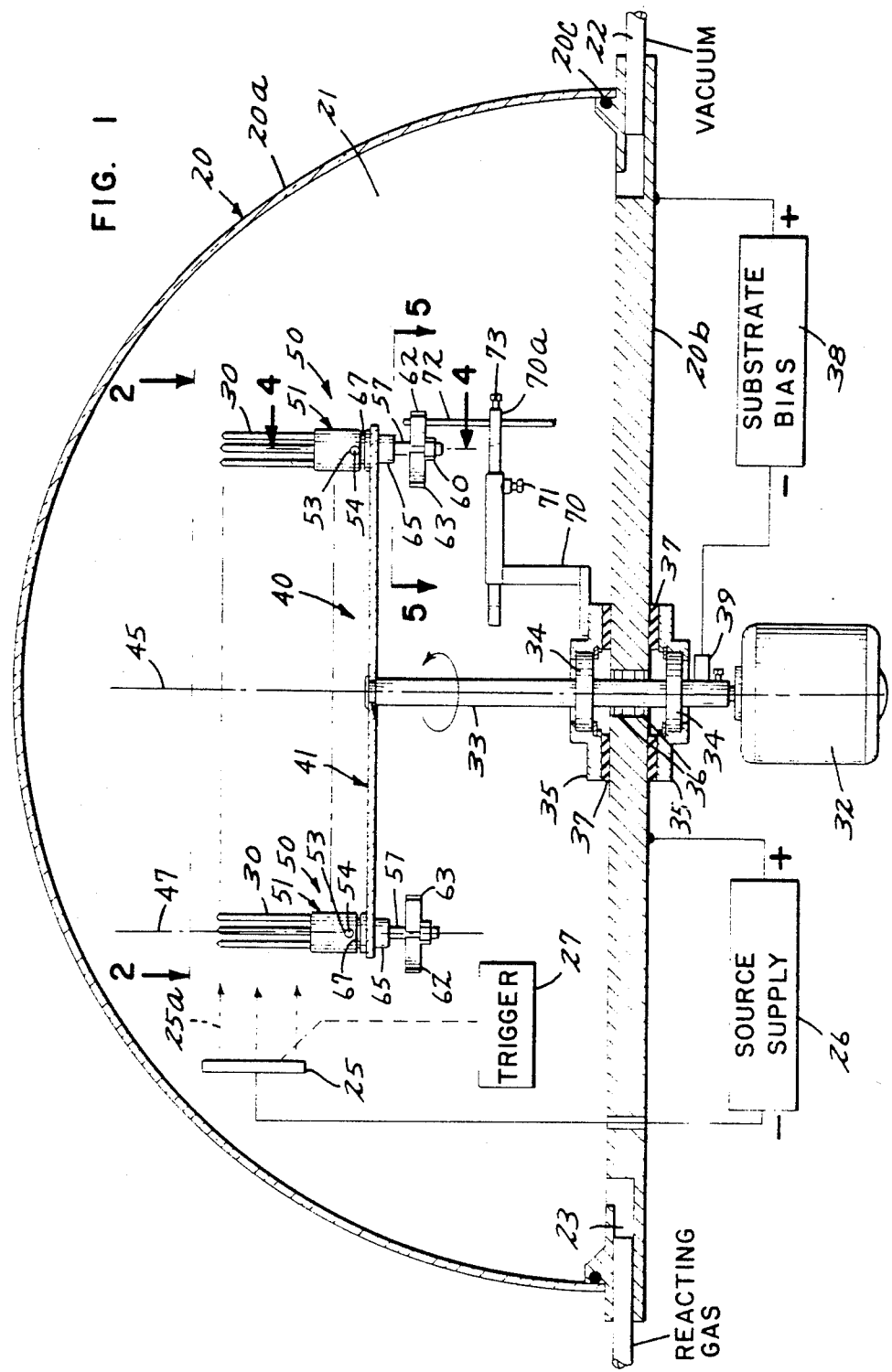
FIG. 1 is a diagrammatic representation of a physical vapor deposition chamber assembly, illustrating a preferred embodiment of a planetary substrate mounting apparatus as it would operatively appear in the deposition chamber and constructed according the principles of this invention.

Referring to the Drawing there is generally illustrated in FIG. 1, a diagrammatic representation of an electric arc vacuum vapor deposition system in which the present invention is particularly useful. Referring thereto, there is generally illustrated at 20 a vapor deposition chamber having an upper shell 20a and lower base plate 20b. The upper shell and lower base plate cooperatively mate and are sealed by appropriate seal means 20c to enclose an inner cavity 21 defining the deposition chamber in which substrates are coated. A vacuum line 22 projects through the base plate 20b and is connected to an appropriate vacuum pump (not illustrated) for evacuating the inner cavity 21, as is well-known in the art. Similarly, one or more inlet ports (such as indicated in at 23) may be provided to the inner cavity 21 for introducing reactive gasses or other elements into the deposition chamber.

A source of coating material 25 is appropriately mounted in the chamber 21, and is merely schematically illustrated in FIG. 1. The coating source 25 represents the origin of coating plasma for the vapor deposition operation. As illustrated in FIG. 1, the source material 25 represents a physical mass of coating material in solid form, such as titanium. It will be understood, however, that the source material 25 could assume other forms other than the solid mass illustrated.

As previously described, a number of techniques are available for converting the source material into a coating "plasma". Such methods do not form a part of this invention, and will not be described herein, but are well understood by those skilled in the art. As schematically illustrated in FIG. 1, the electric arc technique for converting the coating source 25 to a plasma 25a is indicated. In an electric arc vapor deposition system, an electrical potential difference is established and maintained between the source material 25 which acts as a first electrode, and a second electrode. The coating source is typically connected to a negative potential and acts as a cathode, and the deposition chamber itself is connected to a positive potential, and acts as the anode of the electric arc circuit. In FIG. 1, the Source Supply 26 provides the appropriate electrical energization for the electric arc circuit. An activating Trigger network 27 (generally known to those skilled in the art) inititates an arc at the cathode source 25. The arc establishes a current flow path from the cathode source 25 to the anode chamber 20 and through the Source Supply 26, which is thereafter maintained by the Source Supply 26. The arc energy converts the source material 25 to a plasma 25a of vapor and particulate material, generally containing neutral atoms, ions, molecules, ionized molecules and agglomerates of molecules of the source material and of any reacting gasses introduced into the chamber through the inlet port 23. A more detailed description of such a system can be found in U.S. Pat. No. 3,783,231 to Sablev et al.

Articles to be coated by the plasma 25a (typically referred to as substrates 30) are mounted on and carried by a substrate support apparatus, generally referred to at 40. Coating of substrates in such physical vapor deposition chambers as illustrated in FIG. 1, is generally primarily performed by a "line-of-sight" coating process. That is, the majority of the plasma coating particles travel in straight lines outwardly from the coating source 25, and are deposited on any object placed in the path of the plasma article. Therefore, to insure uniform coating on all sides of a substrate 30 within the deposition cavity 21, it is desirable to rotate the substrates 30 within the path of the plasma 25 and/or to provide multiple coating material sources 25 within the cavity 21, to provide multiple line-of-sight plasma paths within the chamber. Further, since the plasma 25a typically contains a number of ions or ionized coating particles, attraction of such ionized particles to the substrates 30 can be enhanced through electrostatic attraction by electrically biasing the substrates to attract the charged particles of the coating plasma.

Referring to FIG. 1, an electric motor 32 has its output shaft coaxially connected to a primary drive shaft 33. The motor and drive shaft assembly is appropriately mounted through a pair of bearings 34 and mounting plates (generally designated at 35) to the base plate 20b, for providing a rotary dirve means about a primary axis 45 within the inner cavity 21. Appropriate seal means, schematically illustrated at 36, are provided for maintaining a vacuum within the inner cavity 21. The motor 32 and drive shaft 33 are electrically isolated from the vapor depòsition chamber 20 by means of insulator members 37. The drive shaft 33 may be constructed of any appropriate material, but is generally a good electrical conductor such as steel. In the embodiment illustrated, an electric potential is applied to the drive shaft 33 by a Power Source 38, through a slip bearing 39. In an electric arc deposition system, the circuit for the Power Source 38 is completed by connection of the positive terminal of the power source 38 to the deposition chamber 20 (i.e. the anode of the system). The drive shaft 33, which applies electrical bias to the substrates 30 (as hereinafter described in more detail) is typically connected to the negative terminal of the substrate bias power supply 38, as illustrated in FIG. 1.

Figure 2:
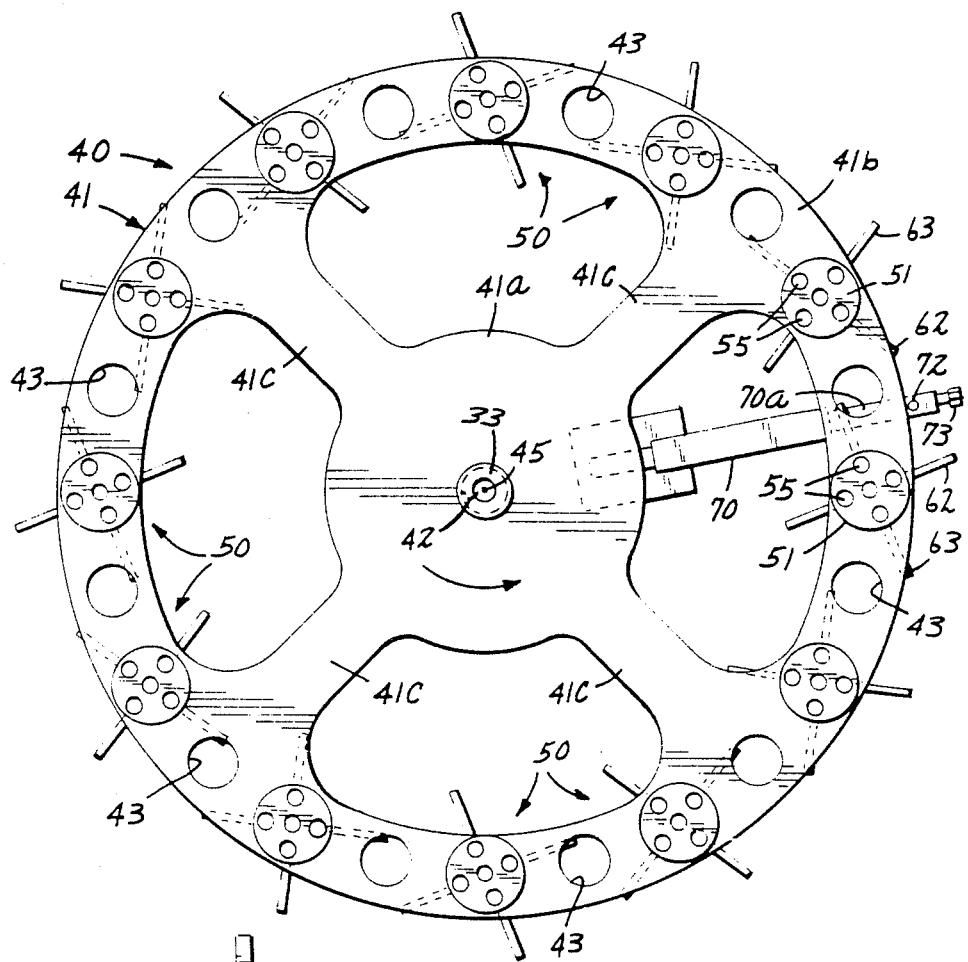
FIG. 2 is a top plan view of the planetary substrate mounting apparatus illustrated in FIG. 1, as generally viewed along the Line 2—2 of FIG. 1.

Referring to FIGS. 1 and 2, the substrate support apparatus 40 of the preferred embodiment generally has a wheel-shaped base or table member 41 having a central hub portion 41a integrally connected to an annular ring portion 41b by a plurality of outwardly radiating spokes 41c. In the preferred embodiment, the base member 41 is constructed of steel, providing adequate support for the substrates to be coated and providing good electrical conductivity between the outer ring 41b and the central hub 41a. The base table 41 is, in the preferred embodiment, symmetrically shaped about a center point fixedly and is appropriately mounted to the shaft 33 as for example by a friction fit or by welding, for rotation therewith about the primary axis 45. The table 41 has a hole through its center, exposing the shaft 33. The shaft 33 has a mounting hole 42 through its upper end and axially extending down into the shaft (see FIG. 2) for mounting a stabilizing member, as hereinafer described. The base member 41 has a plurality of aperatures formed therethrough, in its annular ring 41b and circumferentailly spaced therealong at positions equidistant from the primary axis. Each of the aperatures 43 defines a work station (hereinafter described in more detail). Movement of the base table 41 about the primary axis 45 causes the aperatures 43 (work stations) to travel in a circular "closed" path about the axis 45. While a single "ring" of aperatures 43 (work stations) is illustrated for the embodiments of the invention described herein, it will be appreciated by those skilled in the art, that base members containing multiple rings and "staggered" configurations of such work stations can readily be configured.

In the preferred embodiment, each of the aperatures 43 is configured for cooperatively mounting a substrate holder apparatus, generally referred to at 50 in FIG. 1. The base table 41 is designed for operator use-flexibility such that as many or as few of the substrate holder inserts 50 can be used at any one time in a vapor deposition coating process, as dictated by the nature and number of substrates to be coated, and by the particular coating to be applied. In the embodiment of the invention illustrated in FIG. 2, a substrate holder apparatus 50 is mounted in every other one of the aperatures 43.

A preferred construction of one of the substrate holder means apparatus 50 is illustrated in more detail in FIGS. 3 and 4. Referring thereto, the substrate holder apparatus 50 generally has an upper head or substrate mounting/holder 51. The upper head member 51 is preferrably of cylindrical construction configured symmetrically about an auxiliary axis 47 and is designed to rotatably support one or more substrates to be coated. The head member 51 extends from an upper surface 51a to a lower surface 51b and has an axially aligned mounting hole 52 formed through its lower surface 51b. The substrate mounting head member 51 further has a radially aligned threaded hole 53 extending from the outer cylindrical wall of the head member and opening into the mounting hole 52. A set screw 54 is threaded into the hole 53. The upper head member 51 further has a plurality of substrate mounting holes 55 in its upper surface 51a and downwardly extending into the head member 51 in a direction parellel to that of the auxiliary axis 47. The holes 55 are configured for retainably holding substrates to be coated, as will become apparent upon a more detailed description hereof.

A shaft 57 is coaxially aligned with the upper head member 51 about the auxiliary axis 47, and has a first end 57a sized to cooperatively slide into the lower mounting hole 52 of the upper head member 51. The shaft 57 has an annular recess 58 formed adjacent its first end 57a, forming a locking channel for the set screw 54, which fixedly secures the substrate holder member 51 to the shaft 57. The second lower end 57b of the shaft 57 has a pair of diametrically extending slots 59 formed therethrough. In the preferred embodiment, adjacent ones of such slots 59, are aligned at right angles to one another; however, as will become apparent from a further description of the invention, the angles defined by such slots may vary depending on design constraints, and need not be regularly spaced relative to one another. The second end of the shaft 57b is threaded to receive a nut 60.

A pair of rectangular vane members 62 and 63 are notched respectively at 62a and 63a near their center portions and cooperatively engage one another (as illustrated in FIG. 3) to form a cross-shape vane member, as illustrated in FIG. 4. The vane members 62 and 63 are cooperatively slideably mounted within the slots 59 and are fixedly retained therein by the nut 60. When assembled (as illustrated in FIG. 4) the upper head member 51, the shaft 57 and the vane members 62 and 63 rotatably move about the auxiliary axis 47 as a single integral unit. In the preferred construction, the upper head member 51, the shaft 57 and the vanes 62 and 63 are constructed of steel; however, it will be understood that other materials could equally well be used within the scope of this invention. As with all portions of the substrate support apparatus 40 described herein, the materials used for the various parts can vary, but should all have a low outgassing property for preventing contamination of the evacuated deposition chamber 21.

The head 51, shaft 57 and vane 62, 63 assembly is mounted within an aperature 43 of the base table 41 at a work station by means of a bushing or bearing means. The bushing means preferrably has an outer annular sleeve 65 terminating at its upper end with an annular support flange 65a. The sleeve 65 is sized for cooperative insertion within an aperature 43 and is supported on the upper surface of the base table 41 by means of the support flange 65a. An annular inner core or bushing member 67 is mounted within the outer sleeve 65 and defines an axial passageway 67a therethrough for rotatably accepting and defining a cylindrical bearing surface for the shaft 57, as illustrated in FIG. 4. In that embodiment of the invention illustrated in FIG. 4, the inner core member 67 has a narrow flange portion 67b at its upper end, which axially projects beyond the upper surface of the support flange 65a of the outer core member 65. The upper surface of the inner core member 67 defines a bearing surface for slideably engaging the lower surface 51b of the substrate mounting head 51. The inner core member 67 is preferrably constructed of a durable solid lubricant material that has low friction properties, but which is also electrically conductive. A preferred material selected for this purpose is graphite, or a graphite containing material which has an electrical conductivity that increases with increases in temperature and which has a relatively low coefficient of expansion. It will be understood that other conductive materials such as carbon could also be used. In the preferred embodiment, the outer sleeve 65 is made from steel. The outer sleeve and inner core bushing apparatus may be "loosely" mounted within the aperature 43 of the base table 41 or may be securely fastened to the base table by appropriate fastening means, such as the nut 68 illustrated in phantom in FIG. 4.

The substrate holder apparatus 50 as illustrated in FIG. 4 enables good electrical conduction between the base table 41 and the upper head member 51 whenever the outer sleeve and inner core members 65 and 76 respectively are good conductors. If the material selected for the inner core 67 has good lubricating properties (for example lava or soap stone), but high electrical resistance, such configuration can still be effectively used if the method of physical vapor deposition being used does not require electrical conductivity through the substrates and the base table 41. However, when an inner core 67 of non or poor conducting solid lubricant material is desired, but where electrical conduction between the base table 41 and the upper head member 51 is still required, the relative orientation of the inner core 67 and outer sleeve members 65 can be slightly changed as illustrated in FIG. 17. Referring thereto, it will be noted that the upper flange portion (67b of FIG. 4) has been removed from the inner core member 67, making the upper surfaces of both the outer sleeve 65 and the inner core 67 bearing surfaces for the upper head member 51. In the configuration of the substrate holder apparatus 50 illustrated in FIG. 17, electrical conductivty between the base table 41 and the upper head member 51 is provided directly through the conductive support flange 65a of the outer sleeve 65. The substrate holder apparatus 50 can rapidly be mounted to or removed from an aperature work station 43 as desired, by either loosening the upper head member 51 from the shaft 57 by means of the set screw 54, or by loosening the nut 60 and removing the vanes 62 and 63 from the shaft 57 so that the remaining assembly can be lifted through the aperature 43 from above the base table 41.

Referring to FIG. 1, a pawl mounting bracket 70 is secured to the mounting plate 35. The mounting bracket 70 has a first extension arm 70a telescopically movable in the horizontal direction, and secured at the desired lateral position by a bolt 71. The mounting bracket 70 further has an upwardly extending pawl member 72, that can be vertically adjusted and fixed at the desired height by means of a bolt 73. The pawl 72 is positioned by means of the pawl mounting bracket 70 so as to engage the vane members 62 and 63 of the respective substrate holders 50 as they are carried past the pawl assembly by the rotating table 41. As the pawl 72 engages a vane member, subsequent rotary motion of the base table 41 causes the pawl to apply force to the engaged vane, causing the substrate holder apparatus 50 to rotate about its auxiliary axis 47. An enlarged view of the movement of the vane portion of the substrate holder apparatus 50 as it engages the pawl 52 is illustrated in FIG. 5.

Figure 5:
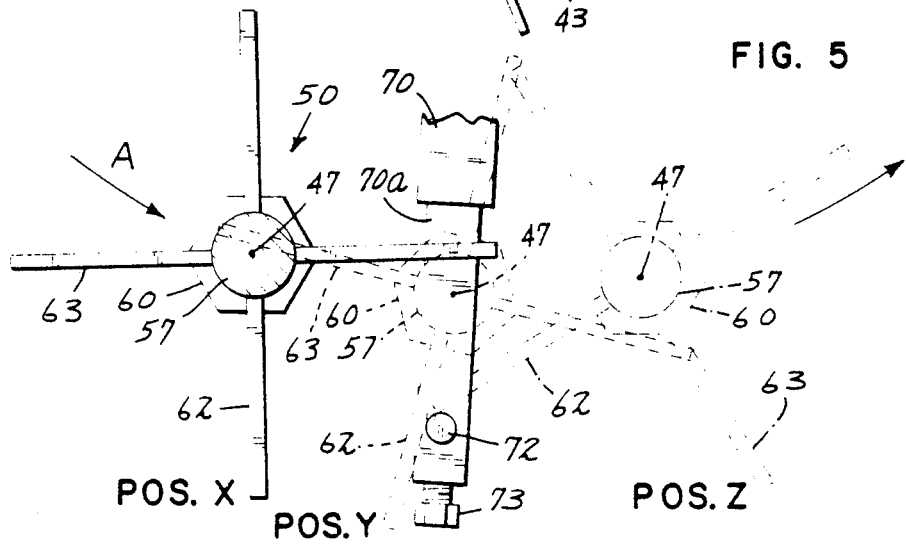
FIG. 5 is an enlarged sectional view of a portion of the planetary substrate mounting apparatus, as generally viewed along the Line 5—5 of FIG. 1, illustrating rotational movement of one of the rotatable satellite substrate mounting members of FIGS. 3 and 4.

Referring to FIG. 5, as the table 41 rotates about the primary axis 45 in a counter-clockwise direction (indicated by the arrow "A"), the vane 62 is positioned to engage the stationary pawl 72, as illustrated at Position "X" in the figure. When the pawl 72 engages the vane 62 as illustrated at Position "Y", subsequent rotation of the table 41 in the counter-clockwise direction will cause the pawl 72 to rotate the vane 62 in a clockwise direction about the auxiliary axis 47, until the pawl disengages from the vane 62. This condition occurs when the rotating base table 41 has advanced the substrate holder apparatus 50 to the position illustrated at Position "Z" in FIG. 5. Thereafter, as the pawl 72 releases from engagement with the vane 62, the substrate holder apparatus 50 will no longer be caused to rotate about its auxiliary axis 47, but will continue to rotate with the support table 41 around the primary axis 45 in the position illustrated at Position "Z". It will be noted that as vane 62 rotates due to engagement with the pawl 72, vane 63 is simultaneously caused to rotate in the clockwise direction by shaft 57, such that after pawl 72 releases from engagement with the vane 62, vane 63 will now be in the rotational position that was at the beginning of the cycle (i.e. as at Position "X").

In the example just described, the rotary clockwise motion imparted to the substrate holder apparatus 50 by engagement of the vane 62 with the pawl 72 is approximately 90 degrees. With a pawl and vane arrangement of the type illustrated in FIG. 5, the angular shaft rotation caused by an engagement of the pawl with a vane will be equal to (360 degrees) divided by "the number of vane arms projecting outwardly from the shaft". This assumes, of course, that the vane arms are equally spaced from one another around the circumference of the shaft 57. Accordingly, if it desired to rotate the substrate holder apparatus 50 through a smaller angle as a result of each engagement with an activating pawl, more vane members should be mounted to the shaft 57. The total number of rotational degrees through which a substrate holder apparatus 50 is rotated in any single "revolution" of the base table 41 in a closed loop around the axis 47, is a function of the number of activating pawl means 72 which the vanes engage during a revolution of the base table 41 and the number of degrees through which the substrate holder is rotated upon engagement with each pawl. In FIG. 2, only one such activating pawl 72 has been illustrated. However, it will be understood that any number of such activation pawls could be mounted along the closed path traversed by the substrate holders, to achieve the desired rotational results. It should also be noted, that for numbering simplicity, only those vane members 62 and 63 of the substrate holder assemblies 50 positioned immediately before and after engagement with the activating pawl 72 have been numbered in FIG. 2.

Figure 6:
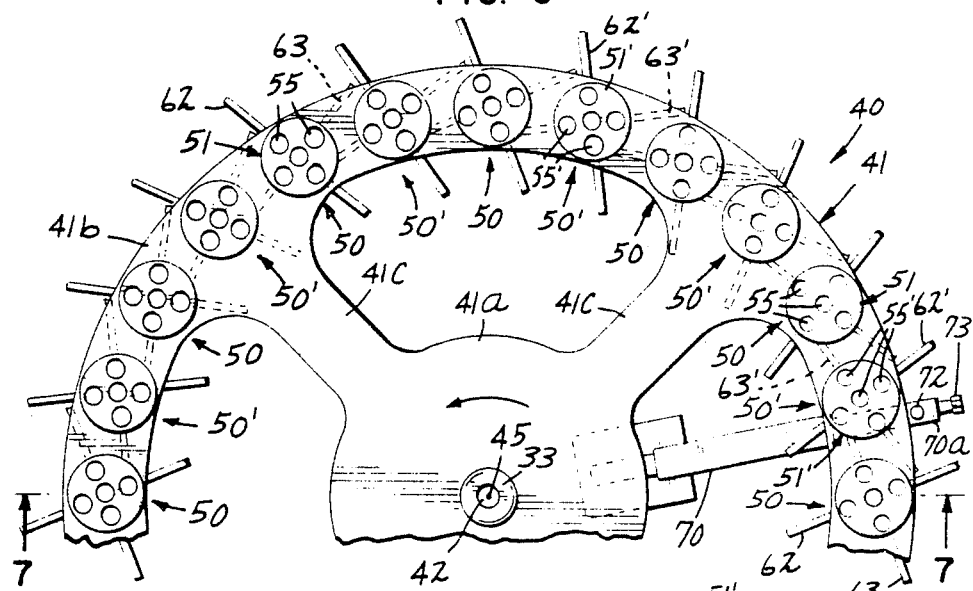
FIG. 6 is a fragmentary top plan view of a second embodiment of a planetary substrate mounting apparatus of the present invention, viewed in similar fashion as that of the first embodiment illustrated in FIG. 5.
Figure 7:
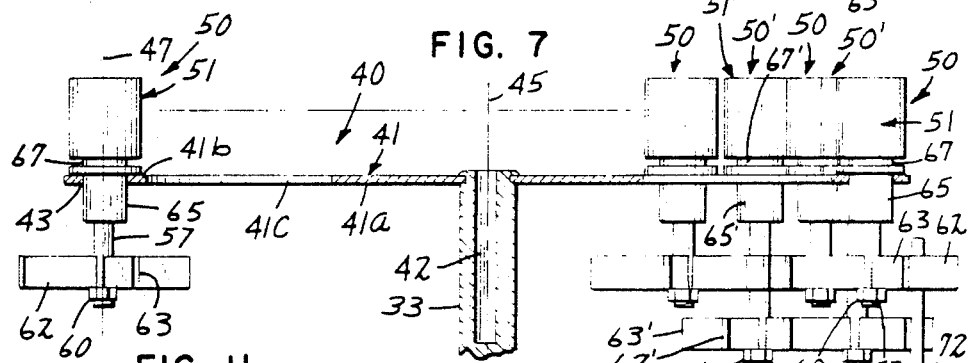
FIG. 7 is a cross-sectional view of the planetary substrate mounting apparatus illustrated in FIG. 6, generally viewed along the Line 7—7 of FIG. 6.

Due to the relative spacing of adjacent aperatures 43 and to the length of the vanes 62 and 63, if identical substrate holder structures 50 as described in FIGS. 2 through 4 were placed in "each" aperature 43 of the base table 41: the movement paths of vane members of adjacent substrate holder structures 50 would overlap, causing the vane to engage one another during activation by a pawl assembly. This would be as a result of the vane movement in a single common plane. The present invention discourages use of such an "intermeshing" structure, which resembles the prior art gear-driven systems, due to the lower reliability and lower useflexibility that such a system would have. However, an alternate embodiment of this invention which uses the base table 41 of FIG. 2, and which maintains the reliability, simplicity and use-flexibility above described, but which enables twice as many substrate holder structures 50 to be rotatably carried thereby, is illustrated in FIGS. 6 and 7. Referring thereto, a two-tiered vane activation structure is used, which fills each aperature 43 with a substrate holder assembly 50. Every second substrate holder apparatus 50' has a longer shaft member 57', which places the vane members 62' and 63' of that support holder 50' operatively lower than those of the adjacent (shorter shaft 57) substrate holder structures 50. As a result, the rotating motion of the vanes 62' and 63' does not interfere with that of the vanes 62 and 63. However, a common pawl member 72 can still be employed to rotate all of the vanes of the assembly as they pass the pawl 72.

Another variation of a multi-level vane arrangement is illustrated in FIGS. 8 through 10. Referring thereto, the same base table 41 multi-level substrate holder apparatus (50, 50') arrangement as previously described with respect to FIGS. 6 and 7 is present. However, the pawl activation structure is different. Those substrate holder structures 50 having the shorter shafts 57 are activated by the first pawl member 72 and associated pawl support structure 70. The pawl support arm 70a and 72 has been radially extended and the pawl 72 has a curved upper activating end, such that it engages only the vanes 62 and 63 of the "upper tier". Those substrate holder structures 50', having the longer shafts 57', are activated by a second pawl 72' which is vertically positioned so as to only engage the vane members of those substrate holder structures 50' of the "lower tier". The activating pawl assembly for engaging the longer-shaft substrate support structures 50' has been denoted by primed designations in FIGS. 8 through 10, wherein like parts of previously described pawl assembly elements carry like reference numbers. It will become apparent to those skilled in the art, that a number of variations and configurations for selectively rotating the various substrate holder structures 50 of this invention are possible by mounting of the substrate holder assemblies 50 within selected ones of the aperatures 43 of the base table 41, by selection and varying of the spacing of the activating pawl members 72, by sizing and arrangment of the vane members on a substrate support assembly 50 and by multi-level structuring of the vane members 62, 63.

As previously discussed, the invention is not limited to a system that rotates about a vertical axis or that uses a base support member such as 41 that is of one-piece construction or even to one which has work stations that travel in circular or other "regular" closed paths. Further, the invention does not require that the substrate holder members 50 always rotate in the "same" direction while their primary support base 41 traverses a closed path. The activating pawl structures can be arranged in combination with the closed path motion such that the substrate holder members alternatively, or selectively, move in both rotational directions about their respective auxiliary axes 47 while traversing the closed path.

Referring to FIG. 1, it will be noted that both the pawl assembly and the vanes which it engages are biased at the same electric potential by the substrate bias supply 38. With such arrangement, there is little or no tendency to develop arcs between the pawl and vane members as they engage and disengage. Further, since the primary path for current flow through the substrates and back to the power supply 38 will be through the upper head member 51, through the bushing means 35 and through the rotating base table 41, little if any current flow will pass from the vane members 62 and 63 and through the pawl member 72.

Figure 11:
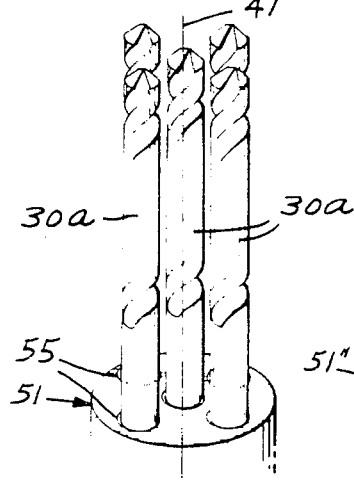
FIG. 11 is a perspective view of one variation of the upper substrate mounting base of the rotatable satellite mounting member of FIG. 3, illustrating its operative use for holding a plurality of drill bits.

The substrate support apparatus of this invention can be adapted to rotatably carry substrates of practically any configuration. The invention has been found to be particularly useful for supporting large numbers of cylindrical substrates such as drill bits, where masking of the coating plasma 25a from adjacent bits otherwise contributes to uneven deposition coating. The upper head member 51 of the substrate holder apparatus 50, illustrated in FIGS. 3 and 4, is configured for holding a plurality of drill bit substrates by means of the substrate mounting holes 55. An illustration of the upper head member 51 actually supporting a plurality of such drill bits 30a is illustrated in FIG. 11.

Figure 12:
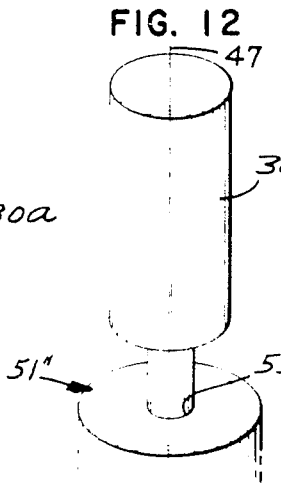
FIG. 12 is a perspective view of a second variation of the upper substrate mounting base of the rotating satellite mounting member of FIG. 3, illustrating its operative use for holding a single elongate substrate to be coated.

Many other variations of the rotatable upper head substrate holder member 51 can be configured, to satisfy the support requirements for the particular substrate(s) being coated. An example of one such variation is illustrated in FIG. 12, wherein the substrate mounting head 51″ contains a single substrate mounting hole 55″ for mounting a single large substrate 30b that is to be coated.

Figure 13:
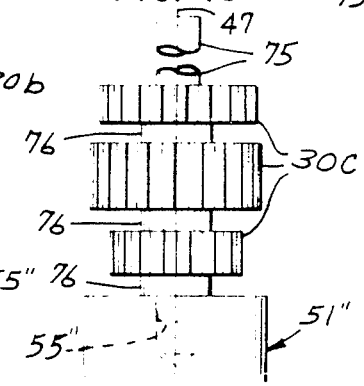
FIG. 13 is a perspective view of a third variation of the upper substrate mounting base of the rotating satellite mounting member of FIG. 3, illustrating its use for supporting a plurality of substrate gears upon a mandrel.

Another application of the substrate holder apparatus 50, using the general construction of the upper substrate mounting head 51″ as previously described, is illustrated in FIG. 13. Referring thereto, a central support shaft or mandrel 75 is mounted within the substrate mounting hole 55″ for coaxial alignment with the auxiliary axis 47. A plurality of ring shaped substrates 30c are concentrically placed over the mandrel 75 in alternating fashion between cylindrical spacing members 76. Such substrates 30c could be of any construction; however, those illustrated in FIG. 13 are in the nature of gears.

Another adaptation of the substrate holder apparatus 50 for rotatably mounting large, heavy substrates such as large gears or hobs is illustrated in FIG. 14. Referring thereto, the upper substrate mounting head 51 is illustrated at the lower portion of the figure. A cylindrically shaped adaptor 77 has a lower opening 77a configured to slidably engage and overly the upper head member 51, for providing an axial extension thereof. The lower end of the adaptor 77 does not come into engagement with either the mounting table 41 or the bearing assembly previously described. A large substrate support hole 77b is axially formed in the adaptor 77 through its upper surface, for receiving either a mandrel 78 or a shaft member of the substrate to be coated. For the structure illustrated in FIG. 14, a mandrel 78 is mounted within the adaptor's upper mounting hole 77b and a large gear substrate 30d is coaxially supported by the mandrel 78 as illustrated.

For coating applications having large, tall or bulky substrates that are supported by the substrate holder apparatus 50, it may be desirable to provide a stabilizing structure for preventing tipping and/or wobbling of the supported substrates as they are transported through the deposition chamber. One such stabilizing structure 80 that is quite simple yet has been found to be particularly useful, is illustrated in FIGS. 15 and 16. The stabilizing structure 80 has an outrigging assembly supported on a central support rod 81. The lower end of the support rod 81 is configured for cooperative mounting insertion within the mounting hole 42 of the primary drive shaft 33, as illustrated in FIG. 16. A mounting bracket 82 is secured to the shaft 81 by a set screw 83 and is adjustable therealong in the axial direction of the shaft 81. The mounting bracket 82 has a plurality of radially aligned holes 82a around its outer periphery, for slidably mounting and holding a plurality of cross members 84 therein, sized for easy insertion and removal from the mounting bracket 82. The cross members 84 project radially outward from the mounting bracket 82, and have downwardly depending portions 84at their free ends. The cross members may be used in any appropriate manner for providing overhead stabilization of the particular substrate being coated, and may assume other configurations than that illustrated. A preferred stabilizing technique is to use the stabilizing cross bar members in cooperation with a mandrel 85 (see FIG. 16) having an upper opening 85a sized to cooperatively accept the downwardly depending ends 84a of the cross bar 84, and a lower end 85b configured for direct insertion within one of the substrate mounting holes 55 of the upper head mounting member 51. Alternatively, the lower end of the mandrel 85 could be recessed, similar to its upper end, for cooperatively engaging a shaft or smaller mandrel member mounted to the upper head member 51. Many variations of such stabilizing structure will become apparent to those skilled in the art. Further, while such stabilizing structure has been illustrated with respect to a particular embodiment wherein the stabilizer "overlies" the rotary table 41, it will be understood that stabilizer means could also be configured so as to lie "below" or to the "sides" of the support table 41.

From the foregoing description, it will be apparent that a substrate supported by the substrate support apparatus described in the preferred embodiments of this invention will travel in a planetary motion about the central axis 45 of the system. In the preferred structure described, such planetary motion assumes an epicycloid path; however, as previously discussed, the invention is not limited to the epicycloid path illustrated, but applies to any closed loop path followed by the work stations supporting the substrates.

Also, as previously discussed, while the present invention has been described with respect to its use in an electric arc vapor vacuum deposition system, its principles apply equally well to other physical deposition systems known in the art. Further, while particular materials have been described with respect to construction of various portions of the apparatus, it will be understood that other materials particularly useful for the specific coating application, can equally well be used. In general, the particular materials and configurations selected for description herein represent simple, low cost configurations that provide surprising reliability and effective results. It will also be understood, that this invention is equally applicable to deposition coating systems that use either AC or DC electrical current and voltage activation.

Other modifications of the invention will become apparent to those skilled in the art in light of the foregoing description. This description is intended to provide specific examples of individual embodiments which clearly distinguish and disclose the present invention. Accordingly, the invention is not limited to the described embodiments, or to the use of specific elements or process techniques described herein. All alternative modifications and variations of the present invention which fall within the broad scope of the appended claims are covered.

I claim:

1. A substrate holder apparatus for rotatably supporting substrates within an evacuated physical vapor deposition chamber during coating processes, comprising:
    (a) a base member configured and arranged for mounting in a physical vapor deposition chamber, said base member defining at least one work station thereon;
    (b) means operatively connected with said base member for moving said base member in a manner causing said work station to traverse a closed path within said chamber;
    (c) a substrate holder suitable for holding at least one substrate to be coated, rotatably mounted to said base member at said work station for rotation about an auxiliary axis, said substrate holder being normally free to move about said auxiliary axis as said substrate holder traverses said closed path; and
    (d) activating means adjacent said closed path for engaging and rotating said substrate holder a predetermined number of degrees about said auxiliary axis as it passes in proximity to said activating means; whereby a substrate carried by said substrate holder is selectively rotated about said auxiliary axis as the substrate is carried along said closed path.

2. A substrate holder apparatus as recited in claim 1, wherein said activating means comprises a plurality of activating members spaced at fixed locations within said chamber along said closed path, each of said activating members being operable to engage and rotate said substrate holder a predetermined number of degrees about said auxiliary axis as said substrate holder passes in proximity to said activating member; whereby a substrate carried by said substrate holder is selectively rotated about said auxiliary axis only at predetermined positions along said closed path.

3. A substrate holder apparatus as recited in claim 1, wherein said base member is configured for rotation about a primary axis, and wherein said closed path is generally circular about said primary axis; whereby a substrate carried by said substrate holder moves in an epicycloid path about said primary axis.

4. A substrate holder apparatus as recited in claim 3, wherein said base member is of generally circular configuration and defines a plurality of said work stations generally circumferentially spaced about said base member; wherein said apparatus includes a plurality of said substrate holders mounted to said base member at said work stations; and wherein said activating means operatively engages and rotates a plurality of said substrate holders as said base member rotates.

5. A substrate holder apparatus as recited in claim 4, wherein said activating means comprises first and second activating members mounted adjacent said closed path for respectively selectively engaging and rotating different ones of said plurality of substrate holders.

6. A substrate holder apparatus as recited in claim 1, wherein said substate holder is configured to hold a plurality of substrates for rotation about said auxiliary axis.

7. A substrate holder apparatus as recited in claim 6, wherein said substrate holder is configured to hold substrates of generally cylindrical shape, and includes means for mounting said cylindrical substrates coaxially with said auxiliary axis.

8. A substrate holder apparatus as recited in claim 1, including stabilizer means operatively connected with said substrate holder for stabilizing and maintaining orientation with respect to said auxiliary axis, of larger substrates carried by said substrate holder as said substrate holder moves along said closed path.

9. A substrate holder apparatus as recited in claim 1, wherein said substrate holder includes at least one vane member mounted for rotation with said substrate holder and projecting outwardly from and forming an angle with said auxiliary axis; and wherein said activating means includes a pawl member oriented so as to cooperatively engage said vane member as said substrate holder moves thereby along said closed path; thereby causing said substrate member to rotate about said auxiliary axis until said vane member disengages from contact with said pawl member.

10. A substrate holder apparatus as recited in claim 9, wherein said substrate holder includes in said vane members defining equal angles between adjacent ones of said vane members about said auxiliary axis; and wherein said pawl member is spaced relative to said closed path such that engagement between said pawl and vane members imparts rotary motion to said substrate holder means through an angle of 360/n degrees about said rotary axis.

11. A substrate holder apparatus as recited in claim 10, wherein said activating means includes a plurality of said pawl members spaced at fixed locations along said closed path for operatively engaging said plurality of vane members.

12. A substrate holder apparatus as recited in claim 1, wherein said substrate holder includes:
    (a) a substrate mounting head member configured to hold at least one substrate to be coated; and
    (b) bearing means interposed between said base member and said substrate mounting head member, and defining a sliding bearing surface therebetween, for reducing friction between said head and base members.

13. A substrate holder apparatus as recited in claim 12, wherein said bearing means is constructed of an electrically conductive material, providing a good electrical conduction path between said base and said mounting head members.

14. A substrate holder apparatus as recited in claim 13, wherein the electrical conductivity of said bearing means material increases with temperature.

15. A substrate holder apparatus as recited in claim 13, wherein said bearing means is constructed at least partially of graphite material.

16. A substrate holder apparatus as recited in claim 12, wherein said bearing means is operatively mounted between said substrate mounting head member and said base member such that said sliding bearing surface is not normally exposed to coating material being deposited in said chamber; whereby the integrity of said bearing surface over extended periods of operative use is maintained.

17. A rotatable substrate support apparatus for use in a physical vacuum vapor deposition chamber for transporting substrates being coated past at least one coating source, in an epicycloid path, said substrate support apparatus comprising:
(a) a rotatable base member having a plurality of aperatures around its periphery;
(b) a first rotatable substrate holder carried by said base member, said holder being rotatably mounted in one of said aperatures and comprising:
(i) substrate mounting means for holding a substrate to be coated;
(ii) a first shaft having first and second ends, said shaft being connected by its first end for movement with said substrate mounting means; and
(iii) a first vane fixedly secured to said shaft adjacent said second end thereof; and
(c) a stationary pawl operatively positioned to engage said first vane as said base member rotates; whereby when said pawl engages said first vane, said substrate mounting means rotates, causing the substrate carried thereby to travel in an epicycloid path.

18. The substrate support apparatus as recited in claim 17, wherein said base member defines upper and lower surfaces; wherein said substrate mounting means is mounted for rotatably supporting a substrate above said upper base member surface; and wherein said vane operatively extends below said lower base surface.

19. The substrate support apparatus as recited in claim 17, wherein said rotatable base member is of spoked configuration; whereby surface area and mass of said base member are reduced.

20. The substrate support apparatus as recited in claim 17, wherein said base member is generally symmetrically configured about a center, and wherein a plurality of said aperatures are positioned equidistant from said center.

21. The substrate support apparatus as recited in claim 17, further comprising bushing means positioned in said one aperature and coaxially aligned with said first shaft for rotatably supporting said substrate mounting means on said base member; wherein said shaft is rotatably mounted within said bushing means.

22. The substrate support apparatus as recited in claim 21, wherein said bushing means is at least partially constructed from graphite material.

23. The substrate support apparatus as recited in claim 21, wherein said bushing means defines a bearing surface upon which said substrate mounting means is rotatably carried.

24. The substrate support apparatus as recited in claim 21, wherein said bushing means has an outer steel sleeve defining a thrust surface for supporting said substrate mounting means, and an inner core of solid lubricant material through which said first shaft passes.

25. The substrate support apparatus as recited in claim 17, wherein said substrate mounting means is generally cylindrical in shape, having top and bottom ends, said top end having at least one hole formed therein for receiving a substrate to be coated, and said bottom end being adapted to cooperatively engage said first end of said shaft.

26. The substrate support apparatus as recited in claim 17, including means for stabilizing said substrate holder as said substrate holder moves with said base member.

27. The substrate support apparatus as recited in claim 26, wherein said stabilizing means comprises an outrigging assembly positioned generally above said base member.

28. The substrate support apparatus as recited in claim 27, wherein said outrigging assembly comprises:
(a) a central support rod having first and second ends, said first support rod end being cooperatively connected to said base member;
(b) a mandrel having first and second ends, said first mandrel end being configured for cooperatively engaging said substrate holder; and
(c) a cross member cooperatively connecting said second end of said mandrel and said second end of said support rod, thereby stabilizing said mandrel on said substrate holder.

29. The substrate support apparatus as recited in claim 17, further comprising a second rotatable substrate holder rotatably mounted in a second one of said aperatures adjacent said first substrate holder, said second substrate holder comprising:
(a) second substrate mounting means for holding a second substrate to be coated;
(b) a second shaft having first and second ends, said second shaft being connected by said first end thereof for movement with said second substrate mounting means; said second shaft being longer than said first shaft; and,
(c) a second vane fixedly secured to said second shaft adjacent its said second end, said second vane being positioned to rotate beyond and free from engagement with said first vane; wherein said pawl is positioned to engage said second vane as said base member rotates, causing said second substrate mounting means to rotate about said second shaft.

30. A rotatable substrate holder apparatus for transporting a substrate being coated within an evacuated physical vapor deposition chamber, comprising:
(a) an upper head member having first and second ends, said first end being configured to support at least one substrate to be coated;
(b) bearing means for slidably supportingly engaging said second end of the upper head member for rotation about an axis, said bearing means defining an axial passageway therethrough and having a support member adapted for mounting said bearing means to a support surface;

(c) a drive shaft having a first end fixedly secured to the second end of said upper head member and rotatably extending through said bearing means passageway to a second end; wherein said shaft freely rotates within said passageway about said axis; and (d) a vane member fixedly secured adjacent the second end of said shaft and projecting outwardly therefrom in cantilevered manner; whereby forces applied to said vane cause said upper head member to rotate about said axis.

31. Substrate holder apparatus as recited in claim 30, wherein said bearing means further comprises an inner liner defining said passageway and slidably engaging said shaft, and an outer sleeve member defining said support member.

32. Substrate holder apparatus as recited in claim 31, wherein said outer sleeve defines an annular flange radially extending from said axis and defining said support member.

33. Substrate holder apparatus as recited in claim 31, wherein said inner liner defines an annular sliding bearing surface axially projecting beyond said sleeve member, for slidably supporting said upper head member.

34. Substrate holder apparatus as recited in claim 33, wherein said inner liner is at least partially constructed of graphite material.

35. Substrate holder apparatus as recited in claim 31, wherein said outer sleeve member defines an annular sliding bearing surface for slidably supporting said upper head member, and wherein said inner sleeve material comprises a solid lubricant material having properties suitable for preventing contamination of an evacuated chamber.

36. Substrate holder apparatus as recited in claim 30, further including a plurality of said vane members fixedly secured adjacent the second end of said shaft and projecting outwardly therefrom in spaced manner about said axis.

37. Substrate holder apparatus as recited in claim 30, further including a mandrel configured for operative connection to said upper head member, for coaxially mounting thereon.

* * * * *

REEXAMINATION CERTIFICATE (635th)
United States Patent [19]
Brandolf

[11] B1 4,485,759
[45] Certificate Issued  Feb. 10, 1987

[54] PLANETARY SUBSTRATE SUPPORT APPARATUS FOR VAPOR VACUUM DEPOSITION COATING

[75] Inventor: Henry E. Brandolf, Inver Grove Heights, Minn.

[73] Assignee: Multi-Arc Vacuum Systems Inc., Saint Paul, Minn.

Reexamination Request:
No. 90/000,854, Sep. 13, 1985

Reexamination Certificate for:
Patent No.: 4,485,759
Issued: Dec. 4, 1984
Appl. No.: 458,902
Filed: Jan. 19, 1983

[51] Int. Cl.[4] ............................................. B05C 11/14
[52] U.S. Cl. .................................... 118/503; 118/500; 118/728; 118/729; 118/730
[58] Field of Search ............... 118/503, 500, 728, 729, 118/730

[56] References Cited

U.S. PATENT DOCUMENTS

| | | | |
|---|---|---|---|
| Re. 10,794 | 1/1887 | Randolph . | |
| 1,954,210 | 4/1934 | Jones | 91/44 |
| 2,912,351 | 11/1959 | Danner et al. | 117/106 |
| 3,743,327 | 7/1973 | Roos | 285/192 |
| 3,993,909 | 11/1976 | Drews et al. | 250/492 A |

*Primary Examiner*—Thurman K. Page

[57] ABSTRACT

A substrate support apparatus (40) for reliably rotatably supporting substrates being coated within an evacuated physical vapor deposition chamber, is disclosed. A base member (41) defining one or more work stations (43) is configured and mounted for movement within a deposition coating chamber (20) such that the work station(s) move along a closed path in the chamber, past one or more coating material sources (25). Substrate holder assemblies (50), configured to support one or more substrates (30) to be coated, are mounted for rotation about auxiliary axes (47) at selectable ones of the work stations. Unique bearing means (65, 67), operable over wide temperature variations, rotatably support the substrate holder assemblies and provide good electrical conduction from the base member (41) to the substrates (30). Bearing surfaces (67b) are protected from contamination by the coating plasma (25a). Independent activating means (70, 72) selectively engage and rotate the substrate holder assemblies through predetermined numbers of degrees, at selected positions along the closed path. A simple vane configuration (62, 63) is used for accepting the activating forces. Stabilizing means (80) are provided for supporting unstable substrates upon the substrate holder assemblies (50). Simple attachment and removal of the substrate holder assemblies (50) to and from the base member (41) enhances use-flexibility of the apparatus.

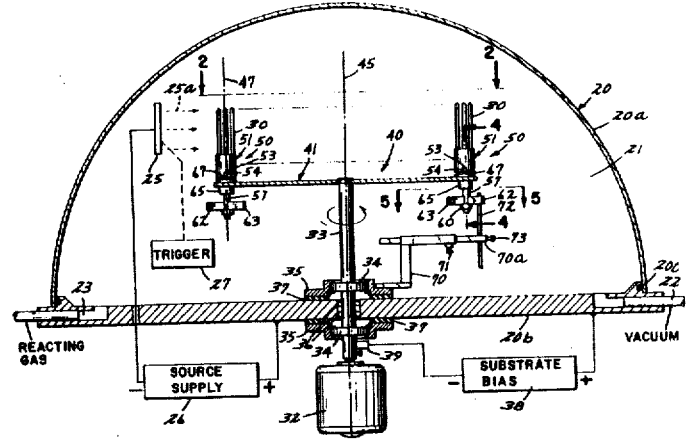

REEXAMINATION CERTIFICATE ISSUED UNDER 35 U.S.C. 307

THE PATENT IS HEREBY AMENDED AS INDICATED BELOW.

Matter enclosed in heavy brackets [] appeared in the patent, but has been deleted and is no longer a part of the patent; matter printed in italics indicates additions made to the patent.

AS A RESULT OF REEXAMINATION, IT HAS BEEN DETERMINED THAT:

Claims 21, 23, 31 and 35 are cancelled.

Claims 1, 10, 12, 13, 17, 29, 30, 32, and 33 are determined to be patentable as amended.

Claims 2-9, 11, 14-16, 18-20, 22, 24-28, 34, 36 and 37, dependent on an amended claim, are determined to be patentable.

New claims 38-40 are added and determined to be patentable.

1. A substrate holder apparatus for rotatably supporting substrates within an evacuated *electric arc* physical vapor deposition chamber during coating processes, *wherein the substrate is biased at a voltage significantly different from that of the coating plasma particles*, comprising:
   (a) a base member configured and arranged for mounting in [a] *an electric arc* physical vapor deposition chamber, said base member defining at least one work station thereon, *said base member being configured to be centrally rotatably supported within said chamber*;
   *(b) means for supporting said base member from a central position of said base member;*
   [(b)] (c) means operatively connected with said base [member] *support means and located external of said chamber* for moving said base member in a manner causing said work station to traverse a closed path within said chamber;
   *(d) bias means operatively connected with said base member for providing an electrical bias voltage to said base member;*
   [(c)] (e) a substrate holder suitable for holding at least one substrate to be coated, rotatably mounted to said base member at said work station for rotation about an auxiliary axis, said substrate holder being normally free to move about said auxiliary axis as said substrate holder traverses said closed path; [and]
   *(f) bearing means operatively engaging said substrate holder for rotatably mounting said substrate holder on said base member and for electrically connecting said substrate holder to said electrical bias voltage;*
   [(d)] (g) activating means *electrically connected at the same bias voltage as said substrate holder*, adjacent said closed path for engaging and rotating said substrate holder a predetermined number of degrees about said auxiliary axis as it passes in proximity to said activating means; whereby a substrate carried by said substrate holder is selectively rotated about said auxiliary axis as the substrate is carried along said closed path; *and*
   *(h) means for electrically isolating said base member and said activating means from said chamber.*

10. A substrate holder apparatus as recited in claim 9, wherein said substrate holder includes [in] *n* said vane members defining equal angles between adjacent ones of said vane members about said auxiliary axis; and wherein said pawl member is spaced relative to said closed path such that engagement between said pawl and vane members imparts rotary motion to said substrate holder means through an angle of 360/n degrees about said rotary axis.

12. A substrate holder apparatus as recited in claim 1, wherein said substrate holder includes[:
   (a)] a substrate mounting head member configured to hold at least one substrate to be coated; and [
   (b)] *wherein said* bearing means *is* interposed between said base member and said substrate mounting head member, and [defining] *defines* a sliding bearing surface therebetween[,] for reducing friction between said head and base members.

13. A substrate holder apparatus as recited in claim 12, wherein said bearing means is constructed of an electrically conductive *solid lubricant* material, providing a good electrical conduction path between said base and said mounting head members.

17. A rotatable substrate support apparatus for use in [a] *an electric arc* physical vacuum vapor deposition chamber for transporting substrates being coated past at least one coating source, in an epicycloid path, said substrate support apparatus comprising:
   (a) a rotatable base member having a plurality of aperatures *formed* around its periphery;
   (b) a first rotatable substrate holder carried by said base member, said holder being rotatably mounted in one of said aperatures and comprising:
      (i) substrate mounting means for holding a substrate to be coated;
      (ii) a first shaft having first and second ends, said shaft being connected by its first end for movement with said substrate mounting means; and
      (iii) a first vane fixedly secured to said shaft adjacent said second end thereof; and
   (c) *bushing means positioned in said one aperature and defining an internal bore portion coaxially aligned with and cooperatively slidably engaging said first shaft and having one end surface thereof defining a seat for slidably rotatably supporting said substrate mounting means on said base, said bushing means having at least that portion thereof defining said bore and said seat constructed of highly conductive solid lubricant material and having an electrical conductivity that increases with temperature; and*
   [(c)] (d) a stationary pawl operatively positioned to engage said first vane as said base member rotates; whereby when said pawl engages said first vane, said substrate mounting means rotates, causing the substrate carried thereby to travel in an epicycloid path.

29. The substrate support apparatus as recited in claim 17, further comprising a second rotatable substrate holder rotatably mounted in a second one of said aperatures adjacent said first substrate holder, said second substrate holder comprising:
   (a) second substrate mounting means for holding a second substrate to be coated;

(b) a second shaft having first and second ends, said second shaft being connected by said first end thereof for movement with said second substrate mounting means; said second shaft being longer than said first shaft;

(c) bushing means positioned in said second aperature and defining an internal bore portion coaxially aligned with and cooperatively slidably engaging said second shaft and having one end surface thereof defining a seat for slidably rotatably supporting said second substrate mounting means on said base, said bushing means having at least that portion thereof defining said bore and said seat constructed of highly conductive solid lubricant material and having an electrical conductivity that increases with temperature; and

[(c)] (d) a second vane fixedly secured to said second shaft adjacent its said second end, said second vane being positioned to rotate beyond and free from engagement with said first vane; wherein said pawl is positioned to engage said second vane as said base member rotates, causing said second substrate mounting means to rotate about said second shaft.

30. A rotatable substrate holder apparatus for transporting a substrate being coated within an *electric arc* evacuated physical vapor deposition chamber, comprising:

(a) an upper head member having first and second ends, said first end being configured to support at least one substrate to be coated;

(b) bearing means for slidably supportingly engaging said second end of the upper head member for rotation about an axis, said bearing means *comprising:* [defining an axial passageway therethrough and]

(i) *an outer sleeve member having a support member adapted for mounting said bearing means to a support surface; and*

(ii) *an inner sleeve member of conductive solid lubricant material having properties suitable for preventing contamination of an evacuated deposition chamber, said inner sleeve member defining an axial passageway therethrough and defining an annular sliding bearing surface for slidably supporting said upper head member for rotation thereon;*

(c) a drive shaft having a first end fixedly secured to the second end of said upper head member and rotatably extending through said bearing means passageway to a second end; wherein said shaft freely *but snuggly* rotates within said passageway about said axis; and (d) a vane member fixedly secured adjacent the second end of said shaft and projecting outwardly therefrom in cantilevered manner; whereby forces applied to said vane cause said upper head member to rotate about said axis.

32. Substrate holder apparatus as recited in claim [31] *30*, wherein said outer sleeve defines an annular flange radially extending from said axis and defining said support member.

33. Substrate holder apparatus as recited in claim [31] *30*, wherein said inner [liner] *sleeve* defines an annular sliding bearing surface axially projecting beyond said *inner* sleeve member, for slidably supporting said upper head member.

*38. A substrate holder apparatus as recited in claim 1, wherein said activating means are positioned along the length of said closed path at generally uniformly spaced intervals therealong, wherein said substrate holder is substantially continually incrementally rotated about said auxiliary axis as said work traverses said closed path.*

*39. A substrate holder apparatus as recited in claim 6, wherein said substrate holder is configured to hold substrates of generally cylindrical shape, and includes means for mounting said cylindrical substrates such that their axes align generally parallel with said auxiliary axis.*

*40. A substrate holder apparatus as recited in claim 9, wherein said substrate holder includes a plurality of said vane members defining equal angles between adjacent ones of said vane members about said auxiliary axis, wherein all of said vane members are of equal length and configuration.*

* * * * *